United States Patent [19]
McLaughlin

[11] Patent Number: 5,659,311
[45] Date of Patent: Aug. 19, 1997

[54] M=6 (2,4) RUNLENGTH LIMITED CODE FOR MULTI-LEVEL DATA

[75] Inventor: Steven W. McLaughlin, Rochester, N.Y.

[73] Assignee: Optex Corporation, Rockville, Md.

[21] Appl. No.: 440,244

[22] Filed: May 12, 1995

[51] Int. Cl.$^6$ .................................................. H03M 7/00
[52] U.S. Cl. .................................................. 341/59; 341/56
[58] Field of Search ............................. 341/56, 57, 59; 375/264, 340; 360/41, 46; 371/43

[56] References Cited

U.S. PATENT DOCUMENTS

| | | | |
|---|---|---|---|
| 4,413,251 | 11/1983 | Adler et al. | 341/59 |
| 4,463,344 | 7/1984 | Adler et al. | 341/59 |
| 4,488,142 | 12/1984 | Franaszek | 341/59 |
| 4,506,252 | 3/1985 | Jacoby et al. | 341/57 |
| 4,566,044 | 1/1986 | Langdon, Jr. et al. | 360/40 |
| 4,691,193 | 9/1987 | Khu | 341/59 |
| 4,760,378 | 7/1988 | Iketani et al. | 341/59 |
| 4,864,536 | 9/1989 | Lindmayer | 365/119 |
| 4,870,414 | 9/1989 | Karabed et al. | 341/57 |
| 4,882,583 | 11/1989 | Dimitri et al. | 341/59 |
| 4,914,438 | 4/1990 | Kameyama | 341/59 |
| 4,928,187 | 5/1990 | Rees | 360/40 |
| 4,949,196 | 8/1990 | Davie et al. | 360/40 |
| 5,047,767 | 9/1991 | Weathers et al. | 341/59 |
| 5,099,237 | 3/1992 | Fitingof | 341/59 |
| 5,136,573 | 8/1992 | Kobayashi | 369/116 |
| 5,142,493 | 8/1992 | Lindmayer | 365/119 |
| 5,163,039 | 11/1992 | Lindmayer | 369/100 |
| 5,173,694 | 12/1992 | Lynch, Jr. et al. | 341/59 |
| 5,196,849 | 3/1993 | Galbraith | 341/59 |
| 5,260,703 | 11/1993 | Nguyen et al. | 341/100 |
| 5,271,016 | 12/1993 | Hilden et al. | 371/37.1 |
| 5,287,228 | 2/1994 | Sawaguchi et al. | 360/57 |
| 5,329,512 | 7/1994 | Fukimoto et al. | 369/116 |
| 5,390,198 | 2/1995 | Higgins | 371/43 |
| 5,398,260 | 3/1995 | Min | 375/286 |
| 5,400,313 | 3/1995 | Belser et al. | 369/116 |

OTHER PUBLICATIONS

M. Tomlinson, "New Automatic Equalizer Employing Modulo Arithmetic," *Electronic Letters*, vol. 7, Nos. 5–6, pp. 138–139, Mar. 25, 1971.

G. Ungerboeck, "Channel Coding With Multilevel/Phase Signals," *IEEE Trans. on Information Theory*, vol. IT–28, No. 1, pp. 55–67, Jan., 1982.

S. W. McLaughlin, "Improved Distance M–ary (d,k) Codes for High Density Recording," Rochester Institute of Technology, Rochester, NY, Jun., 1994.

S. W. McLaughlin et al., "Full Digital Video Read Write Disk Drive Using M–ary Coding," Rochester, Date Unknown.

Brita H. Olson et al., "Multidimensional Partial Response For Parallel Readout Optical Memories," *SPIE*, vol. 2297, pp. 331–337, May, 1994.

Siegel, Paul H., "Recording Codes For Digital Magnetic Storage," *IEEE Transactions On Magnetics*, vol. 21, No. 5, pp. 1344–1349, Sep. 1985.

(List continued on next page.)

*Primary Examiner*—Marc S. Hoff
*Attorney, Agent, or Firm*—Sterne, Kessler, Goldstein & Fox P.L.L.C.

[57] ABSTRACT

A system for encoding digital data with an M-ary (d,k) code to provide multi-level coded data where M>2 comprises an M-ary (d,k) encoder for accepting digital input data. The M-ary (d,k) coder encodes the digital input data to produce a plurality of code symbols, where each code symbol is at one of M levels and each pair of non-zero code symbols is separated by at least d but no more than k zeros. A waveform encoder converts the code symbols into waveform signal amplitudes compatible with a multi-level channel. Each waveform signal amplitude is generated by modulo M addition of a current code symbol with a previous waveform signal amplitude. A specific M=6 (2,4) code provides high density recording to a multi-level storage medium. The M=6 (2,4) encoder is implemented using a six-state encoder and a modulo six waveform encoder.

12 Claims, 3 Drawing Sheets

OTHER PUBLICATIONS

Kobayashi, H. et al., "Application of Partial-response Channel Coding to Magnetic Recording Systems," *IBM J. Res. Develop.*, pp. 368–375, Jul. 1970.

Lindmayer, Dr. Joseph et al., "Electron Trapping Optical Technology —Memory's Next Generation?," *Computer Technology Review*, Summer, 1990.

Earman, Allen, "Optical Data Storage With Electron Trapping Materials Using M-ary Data Channel Coding," *Proceedings of the Optical Data Storage Conference*, SPIE, Feb. 1992, San Jose, California.

Forney, Jr., G. David et al., "Coset Codes For Partial Response Channels; or, Coset Codes With Spectral Nulls," *IEEE Transactions on Information Theory*, vol. 35, No. 5, Sep. 1989, pp. 925–943.

Laroia, Rajiv et al., "A Simple and Effective Precoding Scheme for Noise Whitening on Intersymbol Interference Channels," *IEEE Transactions on Communications*, vol. 41, No. 10, Oct. 1993, pp. 1460–1463.

McLaughlin, Steven et al., "M-ary Runlength Limited Codes for High Density Optical Recording," 1994 *Int'l Symposium on Information Theory*, Trondheim, Norway, Jun. 1994.

Ungerboeck, Gottfried, "Trellis-Coded Modulation with Redundant Signal Sets, Part I: Introduction," *IEEE Communications Magazine*, vol. 25, No. 2, pp. 5–11, Feb. 1987.

Ungerboeck, Gottfried, "Trellis-Coded Modulation with Redundant Signal Sets, Part II: State of the Art," *IEEE Communications Magazine*, vol. 25, No. 2, pp. 12–21, Feb. 1987.

Marcus, Brian et al., "Finite-State Modulation Codes for Data Storage," *IEEE Journal On Selected Areas In Communications*, vol. 10, No. 1, pp. 5–37, Jan. 1992.

Adler, Roy et al., "Algorithms for Sliding Block Codes," *IEEE Transactions in Information Theory*, vol. IT–29, No. 1, pp. 5–22, Jan. 1983.

Forney, Jr., G. David et al., "Combined Equalization and Coding Using Precoding," *IEEE Communications Magazine*, pp. 25–34, Dec. 1991.

McLaughlin, Steven et al., "Modulation Codes for Multi-amplitude Optical Recording Channels," Rochester Institute of Technology, Rochester, New York, paper presented Nov. 1994.

M=6 (2,4) RUNLENGTH LIMITED CODE FOR MULTI-LEVEL DATA

BACKGROUND OF THE INVENTION

1. Field of the Invention

The present invention relates generally to multi-level coding techniques, and more specifically to a system and method for coding data using an M=6 (2,4) runlength limited code, such code being particularly useful for storing and/or transmitting multi-level data.

2. Related Art

Various techniques are currently in use for increasing the recording density on various digital recording mediums such as magnetic tapes and disks and in other similar media. One technique utilizes an approach known as run-length-limited coding. This technique requires that each "1" in a coded bit sequence must be separated by a specified number of "0's". This number of zeros must be at least a minimum quantity, d, to reduce intersymbol interference, and is limited to a maximum quantity k for self clocking purposes. Such codes are generally referred to as (d,k) run-length-limited (RLL) codes.

Because conventional recording techniques use saturation recording to store information, binary recording techniques are often used to mark the recording medium. As a result, conventional (d,k) RLL codes developed to date are developed and optimized to store binary data.

Significant advances in data storage materials have lead to the development of a storage medium that provides a linear response characteristic. One such material providing a linear response characteristic is an electron trapping material such as is disclosed in U.S. Pat. Nos. 4,864,536, 5,007,037, and 5,142,493, all to Lindmayer.

Using a material which provides a linear response characteristic yields an advantage over saturation-type media in that it adds an analog dimension to the storage capacity of the medium. Because the response is linear, the linear-response storage materials provide the ability to encode information in two dimensions—amplitude and phase.

As a result, the storage medium is no longer confined to storing binary or even tri-level data. Instead, the concept of M-ary, or non-binary, data coding and storage is provided. The increased symbol set allowed by such encoding provides the opportunity to dramatically increase the data recording density and transfer rate of the storage device. For example, the potential storage capacity of a single 5¼ inch disk can be extended to several gigabytes if that disk is implemented using electron trapping materials with M-ary (multi-level) data coding.

SUMMARY OF THE INVENTION

The present invention is directed toward an M=6 (2,4) runlength-limited code for multi-level data storage and/or communications. Also disclosed herein is a system and method for generating multi-level data from a binary input data stream using an M-ary (d,k) code such as the M=6 (2,4) runlength limited code.

According to the invention input data bits are coded using an M-ary (d,k) encoder to generate code symbols. Specifically, input data bits x are encoded using the M-ary (d,k) encoder to generate code symbols y, where:

$$x=(x_0, x_1, \ldots x_{p-1})$$

for p input data bits $$y=(y_0, y_1, \ldots y_{q-1}),$$

where p/q=the code rate R

The code symbols y are multi-level symbols, each being at one of M levels. The code symbol stream provided meets the code specifications of no fewer than d and no greater than k zeros between each non-zero symbol. Thus, according to the M=6 (2,4) code disclosed herein, code symbols are each at one of six levels and there is a minimum of two and a maximum of four zeros between each non-zero symbol.

The code symbols y are encoded to generate a series of waveform amplitudes z. The waveform amplitudes are generated by modulo M addition of the current code symbol $y_i$ with the previous waveform amplitude $z_{i-1}$. The waveform amplitudes are used to modulate a write laser to store information onto an optical disk or to otherwise store or communicate the input data bits x in the form of multi-level information.

To recover the original data bits x from the medium, the information stored on the medium is read and the resultant signal amplitudes are decoded. Two stages of decoding are provided. In the first stage, the waveform amplitudes are decoded to generate code symbols. In the second stage, the code symbols are decoded to recover the original data bits.

The system and method described herein for coding and decoding the data is described with respect to the M=6 (2,4) code disclosed herein. However, while other codes may not be obvious in light of the code disclosed herein, given a specific M-ary (d,k) code, after reading the below disclosure, it will become apparent to a person skilled in the relevant art how the disclosed system and method can be implemented to code and decode the data using such a specific M-ary (d,k) code.

An advantage of the invention is that the recording density can be increased by coding the input data using the disclosed M=6 (2,4) code. Because there are at least d zeros between every non-zero code symbol, there can be at least d+1 symbols stored for a given minimum feature size. Given a code of rate R, the density achievable is (d+1)R.

It should be noted that the coding-techniques described herein are not limited to optical recording. Other recording systems capable of supporting multi-level data would benefit from the coding techniques described herein. Additionally, these coding techniques are also applicable to communications systems where the communications channel is capable of supporting multi-level data. In such an implementation, the waveform amplitudes could be used to modulate a signal carrier for transmission across the multi-level channel.

Further features and advantages of the present invention, as well as the structure and operation of various embodiments of the present invention, are described in detail below with reference to the accompanying drawings.

BRIEF DESCRIPTION OF THE DRAWINGS

The present invention is described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE EMBODIMENTS

1. Introduction

Figure 1:
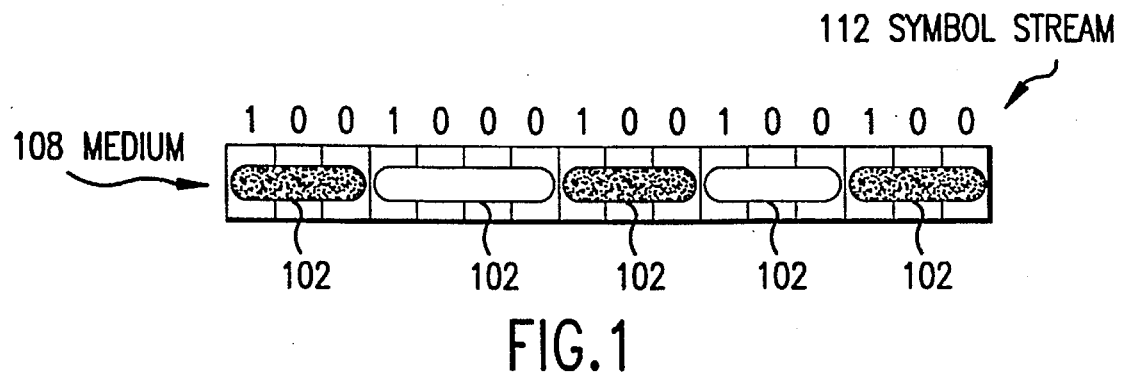
FIG. 1 is a diagram illustrating a portion of an optical storage medium and features thereon.

The present invention is directed toward an M-ary (d,k) code for use in storage and/or transmission of multi-level data, and a system and method for generating the same. This discussion is provided in several sections. In Section 2, before discussing the invention in detail, a brief discussion of binary (d,k) codes is presented. In Section 3, a coding system for coding input data using an M-ary (d,k) code is described. In Section 4, some code design factors are described. In Section 5, a specific M=6 (2,4) code is described that is particularly useful for storage and/or transmission of multi-level data. Section 5 also provides a detailed description of the encoder used to code data using the disclosed M=6 (2,4) code. In Section 6 there is presented a discussion of a sliding block decoder generally useful for decoding M-ary (d,k) codes, as well as a specific decoder for decoding the M=6 (2,4) code described in Section 4.

The present invention is generally described in terms of an embodiment where multi-level data are stored on and retrieved from an optical disk. In such an embodiment, the encoder and decoder described herein may be implemented for multi-level data storage in an optical disk system such as that disclosed in U.S. Pat. No. 5,007,037, which is incorporated herein by reference. However, after reading the below description, it will become apparent to a person skilled in the relevant art how the systems and methods of the invention can be implemented for alternative applications such as multi-level data communications and storage of multi-level data on media other than optical disks. In yet other alternative embodiments, the invention can be implemented to transmit and receive data across an M-ary communications channel. In this document, the term "channel" is sometimes used to refer to the optical disk. It should be understood that in the alternative embodiments the term channel can be used to describe alternative storage media and/or communications channels.

Additionally, after reading the below detailed description of the encoder and decoder of the present invention, it will become apparent to a person skilled in the art that these disclosed components can be implemented using hardware, software or a combination of both hardware and software.

2. Binary (d,k) Run-Length-Limited Coding

Using conventional binary storage techniques, data are written to a storage medium using binary 1's and 0's. Using run-length limited coding, the data to be recorded are first encoded using a run-length-limited encoder. As stated above, with a (d,k) RLL code, there is a minimum and a maximum number of 0's that can occur between each pair of 1's, as specified by the code parameters d and k. Thus, the (d,k) RLL encoder results in a 1 followed by at least d and at most k 0's before another 1 occurs. Such (d,k) RLL codes for binary applications are well known in the art.

To write input data to the saturation storage medium, the input data are first encoded to create symbols. The encoder is designed such that the output symbols conform to the code specifications: each 1 is followed by a minimum of d and a maximum of k 0's. These symbols are then written to the storage medium as a series of features. For example, for optical disks, a feature is the presence or absence of a burn mark. In a magnetic tape, the feature is a grouping of magnetic particles oriented in a particular manner.

FIG. 1 illustrates a portion of an optical storage medium 108 that stores binary data as features 102. Illustrated are shaded and unshaded features 102, indicating the absence or presence of a burn mark. Also illustrated in FIG. 1 is an example symbol stream 112 that is used to write the features 102 to medium 108. As discussed above, symbol stream 112 is the result of encoding input data using a (d,k) RLL code. Symbol stream 112 is written to medium 108 using an additional coding step as follows: the occurrence of a 1 indicates a change in the type of mark (i.e., absence or presence of a burn mark); the occurrence of a 0 indicates no change in mark type. This additional coding step is sometimes referred to as non-return-to-zero interleaved (NRZI) precoding.

Note that with a (d,k) RLL code where d=2, the minimum number of symbols represented by a single feature 102 is three. Thus, for a minimum feature size (e.g., for the smallest spot size on medium 108) three symbols can be represented. As a result, for a rate ½ code, where each input bit corresponds to two symbols, the minimum density of data written to medium 108 is 1.5 bits per feature. Thus, as a result of using the (d,k) RLL coding in the described scenario, the density of the recording system can be increased by 50%.

3. A Generic M-ary Runlength-Limited (d,k) Coder

A few advantages of (d,k) coding are described above with reference to binary data systems. It is important to note that similar gains in density can be realized for storage and communications systems using multi-level (versus binary) data. To optimize such gains, however, new codes and new coding techniques are required to take full advantage of the unique properties of the multi-level data. Thus, the inventors have developed a system and method for encoding data using M-ary (d,k) codes.

Figure 2:
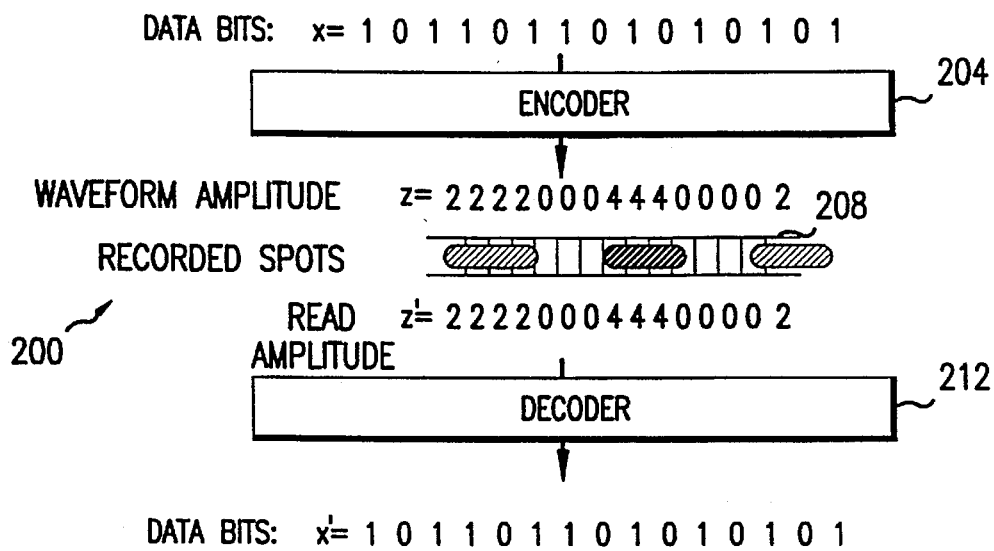
FIG. 2 is a diagram illustrating a data storage system for storing a multi-level coded data.

FIG. 2 is a high-level block diagram generally illustrating a multi-level data recording system 200. The recording system is comprised of an encoder 204, multi-level storage medium 208 and a decoder 212. As stated above, multi-level storage medium 208 can be replaced with a communications channel allowing the multi-level (d,k) code and coding scheme to be used with multi-level data communications. In such a communications embodiment, encoder 204 and decoder 212 can be provided on both ends of the communications channel to allow bi-directional coded communications.

According to the invention, input data bits $x=(x_0, x_1, \ldots, x_{p-1})$ are the actual data that a user wishes to be stored on and retrieved from medium 208. However, to take full advantage of the multi-level properties of medium 208 and to increase the storage density achieved, the invention provides for the encoding of input data x so that multi-level data is stored on medium 208. Such encoding is accomplished using encoder 204.

Figure 3:
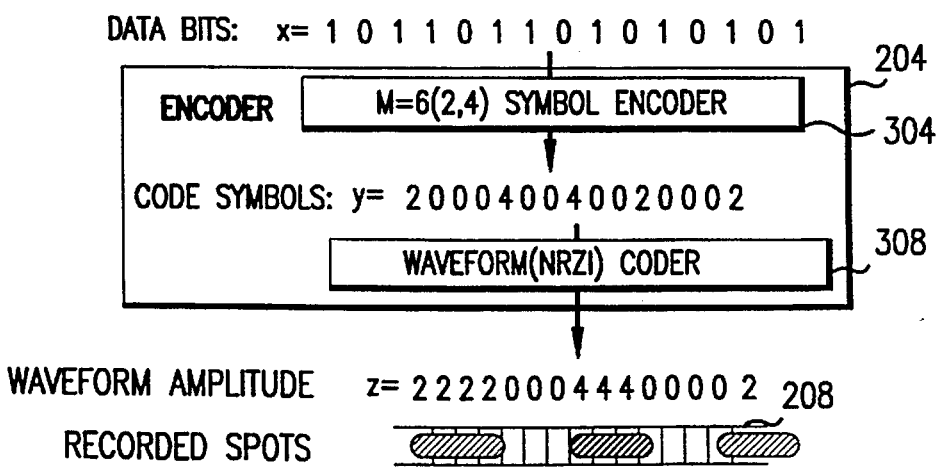
FIG. 3 is a diagram illustrating an encoder for encoding multi-level data using a multi-level (d,k) code.

In one embodiment, encoder 204 is implemented as a two-stage encoder. FIG. 3 is a block diagram illustrating encoder 204 in this embodiment. Referring to FIG. 3, encoder 204 is comprised of a symbol encoder 304 and a waveform encoder 308, referred to herein as encoder 304 and encoder 308, respectively.

Encoder 304 is a (d,k) RLL symbol encoder that accepts the input data bits x and converts them to a stream of code symbols $y=(y_0, Y_1, \ldots, y_{q-1})$. To take advantage of the multi-level characteristics of medium 208, encoder 304 generates code symbols y at M different levels, where M>2. A second feature of encoder 304 is that the stream of code symbols y meets the code specification that there are no fewer than d and no greater than k zeros between each non-zero code symbol. Another feature of encoder 304 is that there are R input bits $x_i$ for each code symbol $y_i$ generated. This feature is referred to as the code rate. Thus for a rate 1/N code (i.e., where R=1/N), there are N code symbols $y_i$ generated for each input data bit $x_i$.

Waveform encoder 308 accepts code symbols y and converts them to a series of waveforms $z=(z_0, z_1, \ldots, z_{q-1})$, each of a given amplitude. Waveform encoder 308 generates output waveforms z, each at one of M different amplitudes. The waveform amplitudes are generated by modulo M addition of the current code symbol $y_i$ with the previous waveform amplitude $z_{i-1}$. It is the waveforms z which are used to modulate a write laser for storing data onto medium 208 (or transmitted across the multi-amplitude channel).

Because there are at a minimum d zeros, between each non-zero code symbol, each waveform amplitude z generated represents, at a minimum, d+1 code symbols y. Also, because there are 1/R code symbols y generated for each input data bit x, each waveform amplitude z generated represents, at a minimum, (d+1)R data bits x. Thus, for a minimum feature size (e.g., the smallest spot that can be written to the storage medium or the shortest pulse that can be transmitted across the communications channel), the density achieved is D=(d+1)R.

Consider this density in terms of the specific M=6 (2,4) code described below. The rate of this code is R=1 and d=2. For this code, the density is 3.0 input data bits $x_i$ per minimum feature size. In other words, 3.0 input data bits can be stored using a single minimum-size feature.

4. Code Design Factors

The coding system and method described above can be used to code input data using any of number of M-ary (d,k) codes. However, the design of a specific M-ary (d,k) code is not a trivial matter.

There are several factors that must be taken into consideration when designing M-ary (d,k) codes. The specific coding scheme used to implement a given code impacts the performance of the encoding and decoding systems. For example, the code should be designed such that encoders and decoders can be implemented in a straight-forward and cost-effective manner. Toward this end, the desirable code can be implemented using encoders that have a relatively small number of states while still meeting the code parameters (i.e., M, d and k). Additionally, the decoder required to decode the coded data should be implementable using a small sliding block window size and the decoder should have a relatively a small table size.

Further, the code design must result in an encoder and decoder that operate such that errors in the decoder side have a minimum effect. It would be undesirable for errors to propagate too far in the decoded data stream. In some less-than-desirable systems, a single decoding error can result in a very large, if not infinite, number of additional decoding errors.

Achievement of such design goals is not a trivial matter. Not every M-ary (d,k) code of a given set of parameter values will perform in a desirable manner. Provided in the next section of this document is a specific M=6 (2,4) runlength-limited code that meets the design goals outlined above.

5. M=6 (2,4) runlength-limited code

As stated above, code design is not a trivial matter as there are several coding factors that affect the performance of the system. The specific code implemented for a given set of parameters can impact the overall performance of the system. This section of the patent document describes a specific M-ary (d,k) code and the specific encoder used to implement this code. In particular, this section describes a specific M=6 (2,4) runlength-limited code having a rate R=1.

Table 1 is a state table illustrating a state machine 400 for encoding input data x to generate code symbols y for the M=6 (2,4) code (i.e. a specific version of encoder 304). State machine 400 is a six-state, M=6 (2,4) encoder. For each input data bit $x_i$, an output code symbol $y_i$ is produced; each output code symbol $y_i$ is at one of six levels (0–5). The various states as well as the inputs and outputs of state machine 400 are illustrated using Table 1.

Figure 4:
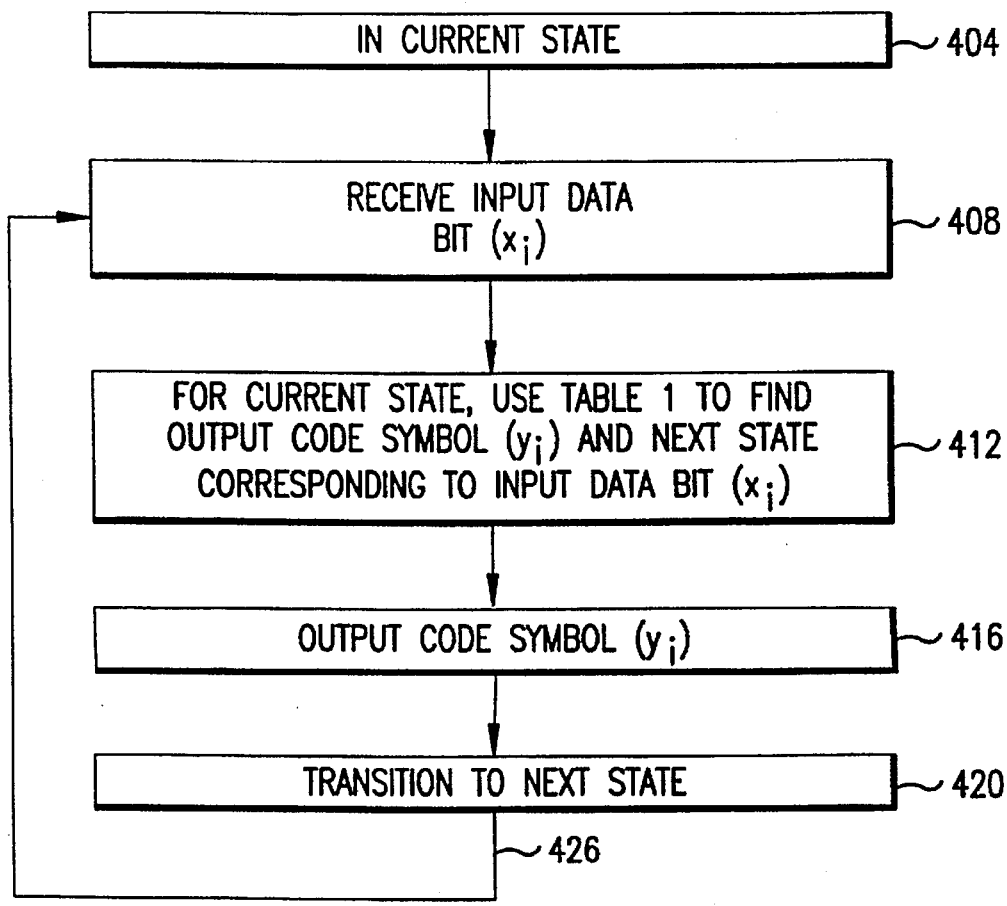
FIG. 4 is a flow diagram illustrating the operation of a multi-state encoder.

FIG. 4 is an operational flow diagram illustrating the operation of state machine 400. The operation of state machine 400 is now described with reference to Table 1 and FIG. 4. In a step 404, the operation starts in a given state at time t=0. In a step 408, an input data bit $x_i$ is received. In a step 412, Table 1 is used to determine the output code symbol $y_i$ and next state from the current state and the input data bit $x_i$ received in step 408. In a step 416, encoder 304 outputs code symbol $y_i$ determined in step 412. In a step 420, state machine 400 transitions to the next state determined in step 412. At this time, the operation continues at step 408 as indicated by flow line 426.

As is evident by the above description, an output code symbol $y_i$ of encoder 304 is a function of the input data bit $x_i$, and the current state 404 of encoder 304. For the M=6 (2,4) encoder of the present invention, Table 1 describes the output code symbol $y_i$ and next state of encoder 304 for each current state and input data bit $x_i$.

TABLE 1

| CURRENT STATE | INPUT $x_i$ | OUTPUT $y_i$ | NEXT STATE |
| --- | --- | --- | --- |
| 0 | 1 | 0 | 3 |
|   | 0 | 0 | 1 |
| 1 | 1 | 0 | 3 |
|   | 0 | 0 | 2 |
| 2 | 1 | 3 | 0 |
|   | 0 | 0 | 3 |
| 3 | 1 | 0 | 4 |
|   | 0 | 0 | 5 |
| 4 | 1 | 1 | 0 |
|   | 0 | 4 | 0 |
| 5 | 1 | 2 | 0 |
|   | 0 | 5 | 0 |

To further illustrate the operation of symbol encoder 304, consider an example input data stream x as illustrated in Table 2. In this example, assume the encoder 304 starts in state 5 and that the first input data bit $x_i$ is '1'. Referring Table 1 for state 5, the row where $x_i$='1' indicates that encoder 304 outputs symbol '2' and transitions to state 0.

Figure 5:
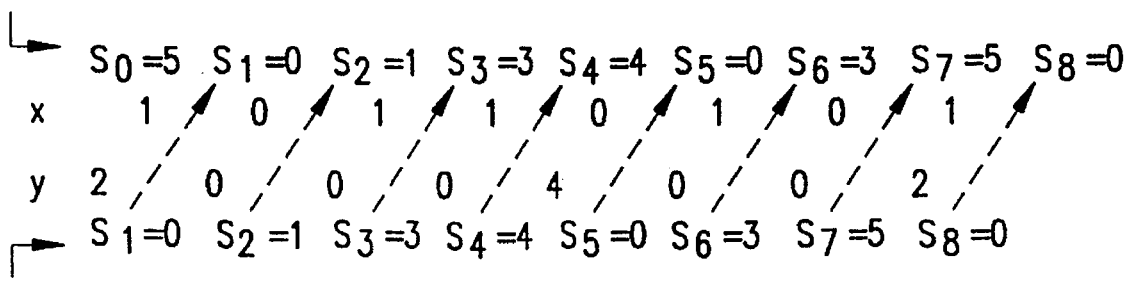
FIG. 5 is a diagram illustrating an example input data stream being coded using the encoder illustrated in FIG. 4.

FIG. 5 is a diagram further illustrating the example. FIG. 5 illustrates a current state 508 and a new state 512 for the example input data stream provided in Table 2. Referring to FIG. 5 and state machine 400, given the input data stream illustrated in Table 2, for each input data bit $x_i$, encoder 304 transitions from a current state 508 to a new state 512 and produces an output symbol $y_i$. FIG. 5 illustrates the example for 8 data bits x of the input data stream while Table 2 is an example for 15 data bits x.

TABLE 2

| x | 1 | 0 | 1 | 1 | 0 | 1 | 1 | 0 | 1 | 0 | 1 | 0 | 1 | 0 | 1 |
|---|---|---|---|---|---|---|---|---|---|---|---|---|---|---|---|
| y | 2 | 0 | 0 | 0 | 4 | 0 | 0 | 4 | 0 | 0 | 2 | 0 | 0 | 0 | 2 |
| z | 2 | 2 | 2 | 2 | 0 | 0 | 0 | 4 | 4 | 4 | 0 | 0 | 0 | 0 | 2 |

As described above with reference to FIG. 3, code symbols y are further coded by waveform encoder 308 to generate a sequence of amplitudes z used to modulate the write laser. According to one embodiment, waveform encoder 308 is a modulo six encoder that, for a given time, determines the waveform amplitude $z_i$ by $$z_i = (z_{i-1} + y_i) \mod M$$

Note that z is a transformed version of y, where the difference (mod M) between waveform amplitudes $z_i$ and $z_{i-1}$ is the coded symbol $y_i$. Thus, in this embodiment, each new code symbol $y_i$ is modulo six added to the previous waveform amplitude $z_{i-1}$ to result in the current waveform amplitude $z_i$. In following the example described above and illustrated in FIG. 5 and Table 2, the code symbols y are encoded by waveform encoder 308 to waveform amplitudes z, as illustrated in Table 2.

To briefly summarize the encoding process, input digital data bits x are first encoded using an M=6 (2,4) symbol encoder to produce code symbols y at M=6 levels. Code symbols y are then encoded by waveform encoder 308 to produce waveform amplitudes z. According to the current code, M=6 amplitudes (illustrated in the above examples as 0–5) are possible. These amplitudes are written to the media by the write laser as illustrated in FIG. 3.

6. Decoder

In order to recover the original data bits x from the amplitudes z stored on the media (or transmitted across the communications channel) a decoder is implemented. In one embodiment, the decoder uses a state independent lookup table to decode amplitude levels z read from the disk. In this embodiment, the decoder is a sliding block decoder, where a sliding window is used to decode amplitudes read from the disk.

Figure 6:
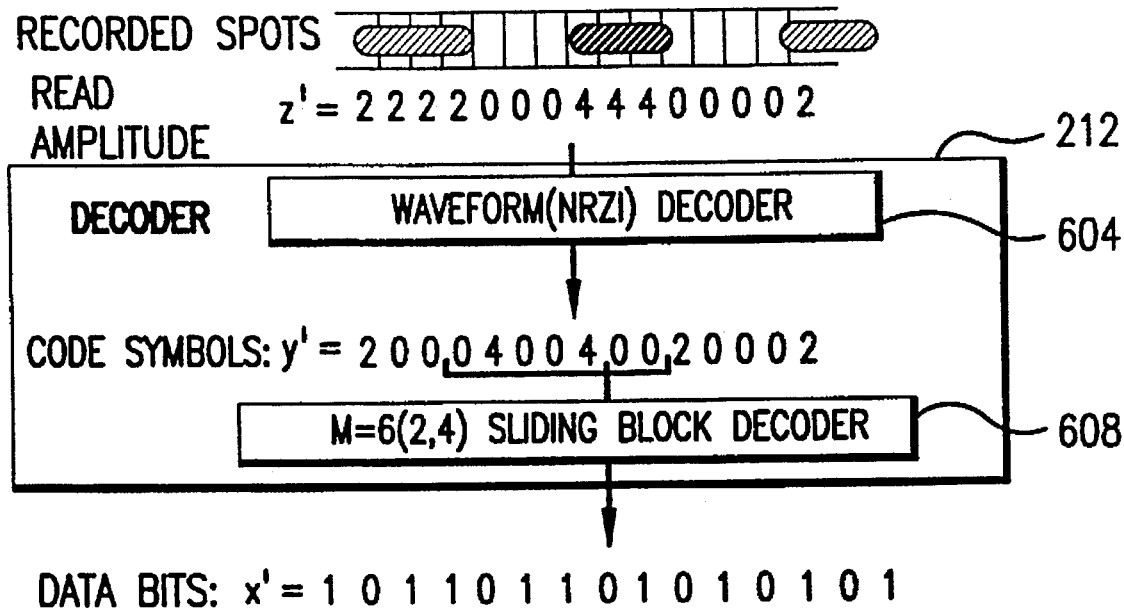
FIG. 6 is a diagram illustrating a decoder for decoding multi-level (d,k) coded data.

FIG. 6 is a block diagram illustrating the decoder. As illustrated in FIG. 6, decoder 212 is comprised of a waveform decoder 604 and a sliding block decoder 608. Waveform decoder 604 receives the signal amplitudes z' (multilevel) from the media and converts them to a sequence of digital code symbols y'. Sliding block decoder 608 performs a table lookup to convert output code symbols y' into output data bits x'. Note that in an error free environment, output code symbols y' correspond identically to input code symbols y and output data bits x' correspond identically to input data bits x.

Any of a number of different techniques can be implemented to read waveform amplitudes z off of the media to provide the signal amplitudes z' to waveform decoder 604. It should be noted that the actual read scheme implemented is not important to the invention as long as data are read accurately.

As stated above, the purpose of waveform decoder 604 is to decode signal amplitudes z' to recover the actual code symbols y'. Waveform decoder converts a sequence of amplitudes $z' = (z'_0, z'_1, \ldots, z'_{N-1})$ where $z'_i \in [0,A]$, for some real number A, to a sequence of code symbols $y' = (y'_0, y'_1, \ldots, y'_{N-1})$.

The operation of waveform decoder 604 is now described. For a given time i, the code symbol $y'_i$ is determined by $$y'_i = (z'_i - z'_{i-1}) \mod M$$

According to this technique, each output symbol y' is determined as being the modulo M difference between the current amplitude waveform $z'_i$ and the previous amplitude waveform $z'_{i-1}$. This decoding essentially undoes the coding performed by waveform encoder 308. Specifically, for M=6 (d,k) codes, such as the M=6 (2,4) code described above in Section 5, the decoding is implemented using a modulo six difference.

6.1 Sliding Block Decoder

The purpose of sliding block decoder 608 is to convert the sequence of code symbols y' into a sequence of data bits x' that coincide with input data bits x. In a preferred embodiment, the decoder is a state independent lookup table. The size of the lookup table is dependent on the specific code implemented. Therefore, the design of encoder 304 affects the size of the lookup table implemented.

Figure 7:
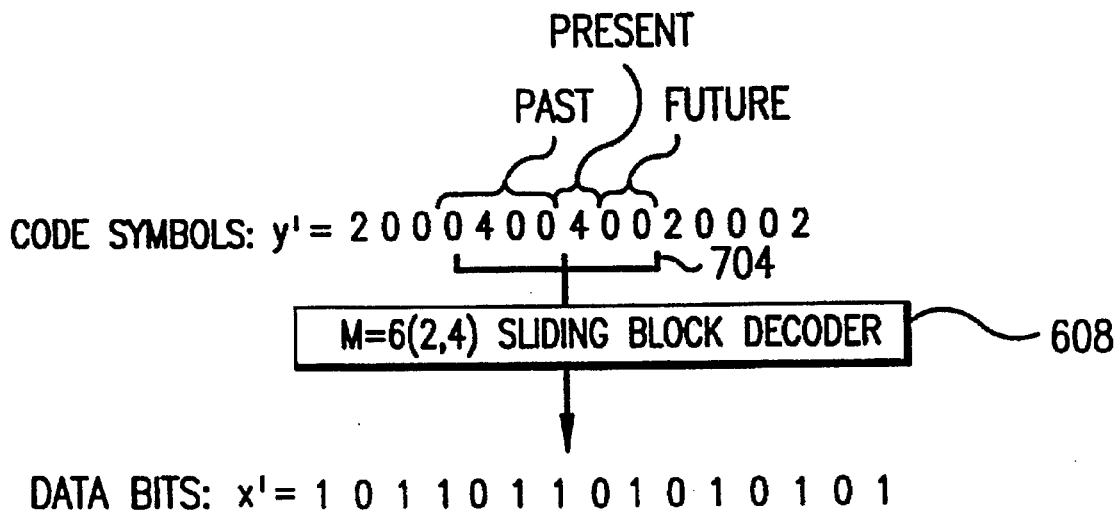
FIG. 7 is a diagram illustrating a sliding block decoder.

Sliding block decoder 608 is illustrated in FIG. 7. Sliding block decoder comprises a sliding window 704 to decode the code symbols y' to arrive at output data bits x'. Whereas encoder 304 accepts one data bit $x_i$ and generates one code symbol $y_i$ therefrom, sliding block decoder 608 must look at multiple code symbols y' to decode one data bit. Specifically, for the encoder described above with reference to Table 1, sliding block decoder 608 requires a block of seven code symbols $y_i'$ to uniquely decode one data bit $x_i'$.

The actual size of sliding window 704 is determined during code design. An optimally sized sliding window 704 is large enough such that the symbols y' within sliding window 704 unambiguously define the correct output bit x' without being so large that unneeded code symbols y' are included therein. In other words, the window size is chosen as the smallest window which guarantees unique decodability.

With the use of a sliding window 704 to decode the data, knowledge of state information is not required. In fact, the contents of sliding window 704 at any given time contain sufficient information such that state information can be determined therefrom. Thus, sliding block decoder 608 is computationally less complex than conventional decoders; more importantly, the sliding block decoder limits the propagation of errors.

Sliding window 704 actually represents the past, present and future. The one code symbol y' actually being decoded to generate a data bit x' represents the present. Past symbols y' are those occurring earlier in time than the present symbol. Likewise, future symbols y' are those that occur after the present symbol. In FIG. 7, the past is represented by '0300', the present by '5', and the future by '00'.

Note that sliding block decoders are well known for decoding binary data. One well known technique for implementing sliding block decoders with binary data is the Adler-Coppersmith-Hassner technique disclosed in U.S. Pat. No. 4,413,251. Another, related technique is disclosed in U.S. Pat. No. 4,882,583 to Dimitri et al. According to these techniques, the number of past symbols required in the window is fixed based on the code design. The number of future symbols should be maintained as small as possible. These goals apply to the M-ary sliding block decoder as well.

The lookup table contains a plurality of entries. In one embodiment, each entry contains a possible sequence of N code symbols y', where N is the size of sliding window 704. In alternative embodiments, each entry of the lookup table is addressed by (directly, indirectly or via a decoding scheme) one of the possible sequences of code symbols.

Based on the specific design of coder 304, there are a limited number of possible occurrences of N code symbols y'. The lookup table comprises a sufficient number of entries such that there is one entry for each of the possible occurrences of N code symbols. As stated above, N is chosen such that for each sequence of N code symbols y' an output bit x' is unambiguously defined.

For the encoder 304 described above with reference to Table 1, the preferred lookup table has 333 entries and is illustrated in Table 3. For each entry of seven code symbols y', there is an output bit x'. Thus, to decode code symbols y', seven consecutive code symbols y' are loaded into sliding window 704. The entry corresponding to those seven code symbols y' is located in the lookup table and the corresponding data bit x' is output. To determine the next output data bit x', sliding window 704 is 'slid' one code symbol y' into the future (i.e., in one embodiment, a next code symbol y' is shifted into window 704 and the oldest shifted out) and the lookup process is repeated. This sliding process continues as long as code symbols y' are provided to sliding block decoder 608.

In one embodiment, the contents of window 704 are real-valued and, therefore, the table entry retrieved is the entry that is closest in squared Euclidean distance. Specifically, for a given window $w=(w_1, \ldots, w_7)$, the distance $d_j$ for each table entry $t_j$ is computed as:

$$d_j^2 = \sum_{i=1}^{7} (w_i - t_{ji})^2 \quad \text{for } j=1, \ldots 333$$

where, $t_{ji}$ is the i'th component of the j'th table entry. The window w is then decoded to the table entry with the minimum distance $d_j$.

Other embodiments are contemplated where the contents of window 704 are used as an address or used to generate an address of an entry in a memory, where the contents of that entry contain the appropriate output data bit x'.

The complexity of the decoding process can be reduced significantly by making hard decisions regarding read signal amplitudes. Specifically, in one embodiment, the read signal amplitudes z' are rounded-off or quantized to be one of the six permissible amplitude levels. Even though this results in a decrease in the performance of the decoder it can significantly reduce its complexity: that is, the table can be a true lookup table requiring no distance calculations.

It should be noted that at the beginning and the end of a data stream, there is a period of time during which window 704 is not full.

TABLE 3

| Sequence of Code Symbols | x' | Sequence of Code Symbols | x' | Sequence of Code Symbols | x' |
| --- | --- | --- | --- | --- | --- |
| 0000500 | 0 | 3002004 | 1 | 1003003 | 0 |
| 0000200 | 1 | 3002001 | 1 | 1003005 | 1 |
| 0000400 | 0 | 3004000 | 0 | 1003002 | 1 |
| 0000100 | 1 | 3004003 | 0 | 1003004 | 1 |
| 0030000 | 0 | 3004005 | 1 | 1003001 | 1 |
| 0030030 | 0 | 3004002 | 1 | 1000500 | 0 |
| 0030005 | 1 | 3004004 | 1 | 1000200 | 1 |
| 0030002 | 1 | 3004001 | 1 | 1000400 | 0 |

TABLE 3-continued

| Sequence of Code Symbols | x' | Sequence of Code Symbols | x' | Sequence of Code Symbols | x' |
| --- | --- | --- | --- | --- | --- |
| 0030004 | 1 | 3001000 | 0 | 1000100 | 1 |
| 0030001 | 1 | 3001003 | 0 | 1005000 | 0 |
| 0030050 | 0 | 3001005 | 1 | 1005003 | 0 |
| 0030020 | 0 | 3001002 | 1 | 1005005 | 1 |
| 0030040 | 1 | 3001004 | 1 | 1005002 | 1 |
| 0030010 | 1 | 3001001 | 1 | 1005004 | 1 |
| 0005000 | 0 | 0500005 | 0 | 1005001 | 1 |
| 0005003 | 0 | 0500002 | 0 | 1002000 | 0 |
| 0005005 | 1 | 0500004 | 0 | 1002003 | 0 |
| 0005002 | 1 | 0500001 | 0 | 1002005 | 1 |
| 0005004 | 1 | 0500300 | 1 | 1002002 | 1 |
| 0005001 | 1 | 0500050 | 0 | 1002004 | 1 |
| 0002000 | 0 | 0500020 | 0 | 1002001 | 1 |
| 0002003 | 0 | 0500040 | 1 | 1004000 | 0 |
| 0002005 | 1 | 0500010 | 1 | 1004003 | 0 |
| 0002002 | 1 | 0500500 | 0 | 1004005 | 1 |
| 0002004 | 1 | 0500200 | 1 | 1004002 | 1 |
| 0002001 | 1 | 0500400 | 0 | 1004004 | 1 |
| 0004000 | 0 | 0500100 | 1 | 1004001 | 1 |
| 0004003 | 0 | 0200005 | 0 | 1001000 | 0 |
| 0004005 | 1 | 0200002 | 0 | 1001003 | 0 |
| 0004002 | 1 | 0200004 | 0 | 1001005 | 1 |
| 0004004 | 1 | 0200001 | 0 | 1001002 | 1 |
| 0004001 | 1 | 0200300 | 1 | 1001004 | 1 |
| 0001000 | 0 | 0200050 | 0 | 1001001 | 1 |
| 0001003 | 0 | 0200020 | 0 | 5000050 | 0 |
| 0001005 | 1 | 0200040 | 1 | 5000020 | 0 |
| 0001002 | 1 | 0200010 | 1 | 5000040 | 1 |
| 0001004 | 1 | 0200500 | 0 | 5000010 | 1 |
| 0001001 | 1 | 0200200 | 1 | 5003000 | 0 |
| 0050000 | 0 | 0200400 | 0 | 5003003 | 0 |
| 0050020 | 0 | 0200100 | 1 | 5003005 | 1 |
| 0050040 | 1 | 0400005 | 0 | 5003002 | 1 |
| 0050010 | 1 | 0400002 | 0 | 5003004 | 1 |
| 0020000 | 0 | 0400004 | 0 | 5003001 | 1 |
| 0020030 | 0 | 0400001 | 0 | 5000500 | 0 |
| 0020005 | 1 | 0400300 | 1 | 5000200 | 1 |
| 0020002 | 1 | 0400050 | 0 | 5000400 | 0 |
| 0020004 | 1 | 0400020 | 0 | 5000100 | 1 |
| 0020001 | 1 | 0400040 | 1 | 5005000 | 0 |
| 0020050 | 0 | 0400010 | 1 | 5005003 | 0 |
| 0020020 | 0 | 0400500 | 0 | 5005005 | 1 |
| 0020040 | 1 | 0400200 | 1 | 5005002 | 1 |
| 0020010 | 1 | 0400400 | 0 | 5005004 | 1 |
| 0040000 | 0 | 0400100 | 1 | 2005001 | 1 |
| 0040030 | 0 | 0100005 | 0 | 5002000 | 0 |
| 0040005 | 1 | 0100002 | 0 | 5002003 | 0 |
| 0040002 | 1 | 0100004 | 0 | 5002005 | 1 |
| 0040004 | 1 | 0100001 | 0 | 2002002 | 1 |
| 0040001 | 1 | 0100300 | 1 | 5002004 | 1 |
| 0040050 | 0 | 0100050 | 0 | 5002001 | 1 |
| 0040020 | 0 | 0100020 | 0 | 5004000 | 0 |
| 0040040 | 1 | 0100040 | 1 | 5004003 | 0 |
| 0040010 | 1 | 0100010 | 1 | 5004005 | 1 |
| 0010000 | 0 | 0100500 | 0 | 5004002 | 1 |
| 0010030 | 0 | 0100200 | 1 | 5004004 | 1 |
| 0010005 | 1 | 0100400 | 0 | 5004001 | 1 |
| 0010002 | 1 | 0100100 | 1 | 5001000 | 0 |
| 0010004 | 1 | 4000050 | 0 | 5001003 | 0 |
| 0010001 | 1 | 4000020 | 0 | 5001005 | 1 |
| 0010050 | 0 | 4000040 | 1 | 5001002 | 1 |
| 0010020 | 0 | 4000010 | 1 | 5001004 | 1 |
| 0010040 | 1 | 4003000 | 0 | 5001001 | 1 |
| 0010010 | 1 | 4003003 | 0 | 2000050 | 0 |
| 0200005 | 0 | 4003005 | 1 | 2000020 | 0 |
| 0300002 | 0 | 4003002 | 1 | 2000040 | 1 |
| 0300004 | 0 | 4003004 | 1 | 2000010 | 1 |
| 0300001 | 0 | 4003001 | 1 | 2003000 | 0 |
| 0300300 | 1 | 4000500 | 0 | 2003003 | 0 |
| 0300050 | 0 | 4000200 | 1 | 2003005 | 1 |
| 0300020 | 0 | 4000400 | 0 | 2003002 | 1 |
| 0300040 | 1 | 4000100 | 1 | 2003004 | 1 |
| 0300010 | 1 | 4005000 | 0 | 2003001 | 1 |
| 0300500 | 0 | 4005003 | 0 | 2000500 | 0 |
| 0300200 | 1 | 4005005 | 1 | 2000200 | 1 |
| 0300400 | 0 | 4005002 | 1 | 2000400 | 0 |

TABLE 3-continued

| Sequence of Code Symbols | x' | Sequence of Code Symbols | x' | Sequence of Code Symbols | x' |
|---|---|---|---|---|---|
| 0300100 | 1 | 4005004 | 1 | 2000100 | 1 |
| 3000050 | 0 | 4005001 | 1 | 2005000 | 0 |
| 3000020 | 0 | 4002000 | 0 | 2005003 | 0 |
| 3000040 | 1 | 4002003 | 0 | 2005005 | 1 |
| 3000010 | 1 | 4002005 | 1 | 2005002 | 1 |
| 3003000 | 0 | 4002002 | 1 | 2005004 | 1 |
| 3003003 | 0 | 4002004 | 1 | 2005001 | 1 |
| 3003005 | 1 | 4002001 | 1 | 2002000 | 0 |
| 3003002 | 1 | 4004000 | 0 | 2002003 | 0 |
| 3003004 | 1 | 4004003 | 0 | 2002005 | 1 |
| 3003001 | 1 | 4004005 | 1 | 2002002 | 1 |
| 3000500 | 0 | 4004002 | 1 | 2002004 | 1 |
| 3000200 | 1 | 4004004 | 1 | 2002001 | 1 |
| 3000400 | 0 | 4004001 | 1 | 2004000 | 0 |
| 3000100 | 1 | 4001000 | 0 | 2004003 | 0 |
| 3005000 | 0 | 4001003 | 0 | 2004005 | 1 |
| 3005003 | 0 | 1004005 | 1 | 2004002 | 1 |
| 3005005 | 1 | 4001002 | 1 | 2004004 | 1 |
| 3005002 | 1 | 4001004 | 1 | 2004001 | 1 |
| 3005004 | 1 | 4001001 | 1 | 1001000 | 0 |
| 3005001 | 1 | 1000050 | 0 | 2001003 | 0 |
| 3002000 | 0 | 1000020 | 0 | 2001005 | 1 |
| 3002003 | 0 | 1000040 | 1 | 2001002 | 1 |
| 3002005 | 1 | 1000010 | 1 | 2001004 | 1 |
| 3002002 | 1 | 1003000 | 0 | 2001001 | 1 |

7. Conclusion

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A method for encoding a series of binary input data bits x into an M=6 run-length limited (2,4) code having a rate R=1, to produce a series of code symbols y, the method comprising the steps of receiving at a six-state encoder an input data bit $x_i$ to be encoded into the M=6 run-length limited (2,4) code, and generating in said encoder a code symbol $y_i$ based on said input data bit $x_i$ according to the following mapping table:

| CURRENT STATE | INPUT $x_i$ | OUTPUT $y_i$ | NEXT STATE |
|---|---|---|---|
| 0 | 1 | 0 | 3 |
|   | 0 | 0 | 1 |
| 1 | 1 | 0 | 3 |
|   | 0 | 0 | 2 |
| 2 | 1 | 3 | 0 |
|   | 0 | 0 | 3 |
| 3 | 1 | 0 | 4 |
|   | 0 | 0 | 5 |
| 4 | 1 | 1 | 0 |
|   | 0 | 4 | 0 |
| 5 | 1 | 2 | 0 |
|   | 0 | 5 | 0 | wherein said code symbol $y_i$ is generated based on the input data bit $x_i$ and the current state of said six-state encoder when said data bit $x_i$ is received.

2. A method for encoding a series of binary input data bits x into an M-ary run-length limited (2,4) code having a rate R=1 to produce a series of code symbols y, each code symbol being at one of M levels, where M>2 and each pair of non-zero code symbols having a minimum of two and a maximum of four zeroes therebetween, the method comprising the steps of receiving at a six-state encoder an input data bit $x_i$ to be encoded into the M-ary run-length limited (2,4) code, and generating in said encoder a code symbol $y_i$ based on said input data bit $x_i$ according to the following mapping table:

| CURRENT STATE | INPUT $x_i$ | OUTPUT $y_i$ | NEXT STATE |
|---|---|---|---|
| 0 | 1 | 0 | 3 |
|   | 0 | 0 | 1 |
| 1 | 1 | 0 | 3 |
|   | 0 | 0 | 2 |
| 2 | 1 | 3 | 0 |
|   | 0 | 0 | 3 |
| 3 | 1 | 0 | 4 |
|   | 0 | 0 | 5 |
| 4 | 1 | 1 | 0 |
|   | 0 | 4 | 0 |
| 5 | 1 | 2 | 0 |
|   | 0 | 5 | 0 | wherein said code symbol $y_i$ is generated based on the input data bit $x_i$ and the current state of said six-state encoder when said data bit $x_i$ is received.

3. A method for converting binary input data bits into a series of waveform amplitudes each amplitude being at one of M=6 levels, the method comprising the steps of:

encoding the binary input data bits into an M=6 (2,4) code having a rate R=1 to produce a series of code symbols, each code symbol being at one of M levels, and each pair of non-zero code symbols having a minimum of two and a maximum of four zeroes therebetween, said encoding step comprising the step of generating a code symbol $y_i$ for each input data bit $x_i$ according to the following mapping table:

| CURRENT STATE | INPUT $x_i$ | OUTPUT $y_i$ | NEXT STATE |
|---|---|---|---|
| 0 | 1 | 0 | 3 |
|   | 0 | 0 | 1 |
| 1 | 1 | 0 | 3 |
|   | 0 | 0 | 2 |
| 2 | 1 | 3 | 0 |
|   | 0 | 0 | 3 |
| 3 | 1 | 0 | 4 |
|   | 0 | 0 | 5 |
| 4 | 1 | 1 | 0 |
|   | 0 | 4 | 0 |
| 5 | 1 | 2 | 0 |
|   | 0 | 5 | 0 | wherein said code symbol $y_i$ is generated based on the input data bit $x_i$ and the current state of said six-state encoder when said data bit $x_i$ is received; and generating in a waveform encoder waveform signal amplitudes based on said code symbols, wherein each said waveform signal amplitude is generated by modulo six addition of a current code symbol with a previous waveform signal amplitude.

4. In a data storage system having storage media capable of storing data at multiple levels, a method for converting binary input data bits into a series of waveform amplitudes each amplitude being at one of M=6 levels and storing the waveform amplitudes on the storage medium, the method comprising the steps of:

encoding the binary input data bits into an M=6 (2,4) code having a rate R=1 to produce a series of code symbols, each code symbol being at one of M levels, and each pair of non-zero code symbols having a minimum of two and a maximum of four zeroes therebetween, comprising the step of generating a code symbol $y_i$ for each input data bit $x_i$ according to the following mapping table:

| CURRENT STATE | INPUT $x_i$ | OUTPUT $y_i$ | NEXT STATE |
|---|---|---|---|
| 0 | 1 | 0 | 3 |
|   | 0 | 0 | 1 |
| 1 | 1 | 0 | 3 |
|   | 0 | 0 | 2 |
| 2 | 1 | 3 | 0 |
|   | 0 | 0 | 3 |
| 3 | 1 | 0 | 4 |
|   | 0 | 0 | 5 |
| 4 | 1 | 1 | 0 |
|   | 0 | 4 | 0 |
| 5 | 1 | 2 | 0 |
|   | 0 | 5 | 0 | wherein said code symbol $y_i$ is generated based on the input data bit $x_i$ and the current state of said six-state encoder when said data bit $x_i$ is received;

generating in a waveform encoder waveform signal amplitudes based on said code symbols, wherein each said waveform signal amplitude is generated by modulo six addition of a current code symbol with a previous waveform signal amplitude; and modulating a write signal with said waveform signal amplitudes to write a series of features to the storage medium, each feature being at a level corresponding to a waveform signal amplitude.

5. The method according to claim 4, wherein said waveform signal amplitudes modulate a write laser and wherein said modulated write laser writes features onto the storage medium.

6. The method according to claim 4, further comprising the steps of:

reading the storage medium to recover output waveform signal amplitudes;

converting said output waveform signal amplitudes into output code symbols, wherein each output code symbol is at one of six levels; and decoding said output code symbols to obtain output data bits, wherein said output data bits correspond to the digital input data.

7. The method of claim 6, wherein said step of decoding comprises the steps of:

identifying with a sliding window a sequence of code symbols that represents a given code symbol set; and in a table comprising a number of entries corresponding to a number of possible unique sequences of code symbols, each entry identified by one of said possible unique sequences of code symbols, and wherein each entry identifies an output data bit set that is a decoded data bit set for the code symbol set represented by the sequence of code symbols that identifies that entry, looking up with said identified sequence of code symbols the output data bit for said given code symbol.

8. The method according to claim 7, wherein said lookup table provides an output bit x' for each sequence of code symbols y' according to the following table:

| Sequence of Code Symbols | x' | Sequence of Code Symbols | x' | Sequence of Code Symbols | x' |
|---|---|---|---|---|---|
| 0000500 | 0 | 3002004 | 1 | 1003003 | 0 |
| 0000200 | 1 | 3002001 | 1 | 1003005 | 1 |
| 0000400 | 0 | 3004000 | 0 | 1003002 | 1 |
| 0000100 | 1 | 3004003 | 0 | 1003004 | 1 |
| 0030000 | 0 | 3004005 | 1 | 1003001 | 1 |
| 0030030 | 0 | 3004002 | 1 | 1000500 | 0 |
| 0030005 | 1 | 3004004 | 1 | 1000200 | 1 |
| 0030002 | 1 | 3004001 | 1 | 1000400 | 0 |
| 0030004 | 1 | 3001000 | 0 | 1000100 | 1 |
| 0030001 | 1 | 3001003 | 0 | 1005000 | 0 |
| 0030050 | 0 | 3001005 | 1 | 1005003 | 0 |
| 0030020 | 0 | 3001002 | 1 | 1005005 | 1 |
| 0030040 | 1 | 3001004 | 1 | 1005002 | 1 |
| 0030010 | 1 | 3001001 | 1 | 1005004 | 1 |
| 0005000 | 0 | 0500005 | 0 | 1005001 | 1 |
| 0005003 | 0 | 0500002 | 0 | 1002000 | 0 |
| 0005005 | 1 | 0500004 | 0 | 1002003 | 0 |
| 0005002 | 1 | 0500001 | 0 | 1002005 | 1 |
| 0005004 | 1 | 0500300 | 1 | 1002002 | 1 |
| 0005001 | 1 | 0500050 | 0 | 1002004 | 1 |
| 0002000 | 0 | 0500020 | 0 | 1002001 | 1 |
| 0002003 | 0 | 0500040 | 1 | 1004000 | 0 |
| 0002005 | 1 | 0500010 | 1 | 1004003 | 0 |
| 0002002 | 1 | 0500500 | 0 | 1004005 | 1 |
| 0002004 | 1 | 0500200 | 1 | 1004002 | 1 |
| 0002001 | 1 | 0500400 | 0 | 1004004 | 1 |
| 0004000 | 0 | 0500100 | 1 | 1004001 | 1 |
| 0004003 | 0 | 0200005 | 0 | 1001000 | 0 |
| 0004005 | 1 | 0200002 | 0 | 1001003 | 0 |
| 0004002 | 1 | 0200004 | 0 | 1001005 | 1 |
| 0004004 | 1 | 0200001 | 0 | 1001002 | 1 |
| 0004001 | 1 | 0200300 | 1 | 1001004 | 1 |
| 0001000 | 0 | 0200050 | 0 | 1001001 | 1 |
| 0001003 | 0 | 0200020 | 0 | 5000050 | 0 |
| 0001005 | 1 | 0200040 | 1 | 5000020 | 0 |
| 0001002 | 1 | 0200010 | 1 | 5000040 | 1 |
| 0001004 | 1 | 0200500 | 0 | 5000010 | 1 |
| 0001001 | 1 | 0200200 | 1 | 5003000 | 0 |
| 0050000 | 0 | 0200400 | 0 | 5003003 | 0 |
| 0050020 | 0 | 0200100 | 1 | 5003005 | 1 |
| 0050040 | 1 | 0400005 | 0 | 5003002 | 1 |
| 0050010 | 1 | 0400002 | 0 | 5003004 | 1 |
| 0020000 | 0 | 0400004 | 0 | 5003001 | 1 |
| 0020030 | 0 | 0400001 | 0 | 5000500 | 0 |
| 0020005 | 1 | 0400300 | 1 | 5000200 | 1 |
| 0020002 | 1 | 0400050 | 0 | 5000400 | 0 |
| 0020004 | 1 | 0400020 | 0 | 5000100 | 1 |
| 0020001 | 1 | 0400040 | 1 | 5005000 | 0 |
| 0020050 | 0 | 0400010 | 1 | 5005003 | 0 |
| 0020020 | 0 | 0400500 | 0 | 5005005 | 1 |
| 0020040 | 1 | 0400200 | 1 | 5005002 | 1 |
| 0020010 | 1 | 0400400 | 0 | 5005004 | 1 |
| 0040000 | 0 | 0400100 | 1 | 2005001 | 1 |
| 0040030 | 0 | 0100005 | 0 | 5002000 | 0 |
| 0040005 | 1 | 0100002 | 0 | 5002003 | 0 |
| 0040002 | 1 | 0100004 | 0 | 5002005 | 1 |
| 0040004 | 1 | 0100001 | 0 | 2002002 | 1 |
| 0040001 | 1 | 0100300 | 1 | 5002004 | 1 |
| 0040050 | 0 | 0100050 | 0 | 5002001 | 1 |
| 0040020 | 0 | 0100020 | 0 | 5004000 | 0 |
| 0040040 | 1 | 0100040 | 1 | 5004003 | 0 |
| 0040010 | 1 | 0100010 | 1 | 5004005 | 1 |
| 0010000 | 0 | 0100500 | 0 | 5004002 | 1 |
| 0010030 | 0 | 0100200 | 1 | 5004004 | 1 |
| 0010005 | 1 | 0100400 | 0 | 5004001 | 1 |
| 0010002 | 1 | 0100100 | 1 | 5001000 | 0 |
| 0010004 | 1 | 4000050 | 0 | 5001003 | 0 |
| 0010001 | 1 | 4000020 | 0 | 5001005 | 1 |
| 0010050 | 0 | 4000040 | 1 | 5001002 | 1 |
| 0010020 | 1 | 4000010 | 1 | 5001004 | 1 |
| 0010040 | 1 | 4003000 | 0 | 5001001 | 1 |
| 0010010 | 1 | 4003003 | 0 | 2000050 | 0 |
| 0200005 | 0 | 4003005 | 1 | 2000020 | 0 |
| 0300002 | 0 | 4003002 | 1 | 2000040 | 1 |
| 0300004 | 0 | 4003004 | 1 | 2000010 | 1 |
| 0300001 | 0 | 4003001 | 1 | 2003000 | 0 |
| 0300300 | 1 | 4000500 | 0 | 2003003 | 0 |

-continued

| Sequence of Code Symbols | x' | Sequence of Code Symbols | x' | Sequence of Code Symbols | x' |
|---|---|---|---|---|---|
| 0300050 | 0 | 4000200 | 1 | 2003005 | 1 |
| 0300020 | 0 | 4000400 | 0 | 2003002 | 1 |
| 0300040 | 1 | 4000100 | 1 | 2003004 | 1 |
| 0300010 | 1 | 4005000 | 0 | 2003001 | 1 |
| 0300500 | 0 | 4005003 | 0 | 2000500 | 0 |
| 0300200 | 1 | 4005005 | 1 | 2000200 | 1 |
| 0300400 | 0 | 4005002 | 1 | 2000400 | 0 |
| 0300100 | 1 | 4005004 | 1 | 2000100 | 1 |
| 3000050 | 0 | 4005001 | 1 | 2005000 | 0 |
| 3000020 | 0 | 4002000 | 0 | 2005003 | 0 |
| 3000040 | 1 | 4002003 | 0 | 2005005 | 1 |
| 3000010 | 1 | 4002005 | 1 | 2005002 | 1 |
| 3003000 | 0 | 4002002 | 1 | 2005004 | 1 |
| 3003003 | 0 | 4002004 | 1 | 2005001 | 1 |
| 3003005 | 1 | 4002001 | 1 | 2002000 | 0 |
| 3003002 | 1 | 4004000 | 0 | 2002003 | 0 |
| 3003004 | 1 | 4004003 | 0 | 2002005 | 1 |
| 3003001 | 1 | 4004005 | 1 | 2002002 | 1 |
| 3000500 | 0 | 4004002 | 1 | 2002004 | 1 |
| 3000200 | 1 | 4004004 | 1 | 2002001 | 1 |
| 3000400 | 0 | 4004001 | 1 | 2004000 | 0 |
| 3000100 | 1 | 4001000 | 0 | 2004003 | 0 |
| 3005000 | 0 | 4001003 | 0 | 2004005 | 1 |
| 3005003 | 0 | 1004005 | 1 | 2004002 | 1 |
| 3005005 | 1 | 4001002 | 1 | 2004004 | 1 |
| 3005002 | 1 | 4001004 | 1 | 2004001 | 1 |
| 3005004 | 1 | 4001001 | 1 | 1001000 | 0 |
| 3005001 | 1 | 1000050 | 0 | 2001003 | 0 |
| 3002000 | 0 | 1000020 | 0 | 2001005 | 1 |
| 3002003 | 0 | 1000040 | 1 | 2001002 | 1 |
| 3002005 | 1 | 1000010 | 1 | 2001004 | 1 |
| 3002002 | 1 | 1003000 | 0 | 2001001 | 1. |

9. The method of claim 7, wherein said look-up step comprises the step of determining, using a squared euclidean distance, which table entry is identified by a sequence of code symbols.

10. A method for decoding data stored on a storage medium, wherein said stored data has been encoding using an M=6 (2,4) code, comprising the steps of:

reading the storage medium to recover output waveform signal amplitudes;

converting said output waveform signal amplitudes into output code symbols, wherein each output code symbol is at one of six levels; and decoding said output code symbols to obtain output data bits, wherein said output data bits correspond to the digital input data.

11. The method of claim 10, wherein said step of decoding comprises the steps of:

identifying with a sliding window a sequence of code symbols that represents a given code symbol set; and in a table comprising a number of entries corresponding to a number of possible unique sequences of code symbols, each entry identified by one of said possible unique sequences of code symbols, and wherein each entry identifies an output data bit set that is a decoded data bit set for the code symbol set represented by the sequence of code symbols that identifies that entry, looking up with said identified sequence of code symbols the output data bit for said given code symbol.

12. The method according to claim 11, wherein said table provides an output bit x' for each sequence of code symbols y' according to the following table:

| Sequence of Code Symbols | x' | Sequence of Code Symbols | x' | Sequence of Code Symbols | x' |
|---|---|---|---|---|---|
| 0000500 | 0 | 3002004 | 1 | 1003003 | 0 |
| 0000200 | 1 | 3002001 | 1 | 1003005 | 1 |
| 0000400 | 0 | 3004000 | 0 | 1003002 | 1 |
| 0000100 | 1 | 3004003 | 0 | 1003004 | 1 |
| 0030000 | 0 | 3004005 | 1 | 1003001 | 1 |
| 0030030 | 0 | 3004002 | 1 | 1000500 | 0 |
| 0030005 | 1 | 3004004 | 1 | 1000200 | 1 |
| 0030002 | 1 | 3004001 | 1 | 1000400 | 0 |
| 0030004 | 1 | 3001000 | 0 | 1000100 | 1 |
| 0030001 | 1 | 3001003 | 0 | 1005000 | 0 |
| 0030050 | 0 | 3001005 | 1 | 1005003 | 0 |
| 0030020 | 0 | 3001002 | 1 | 1005005 | 1 |
| 0030040 | 1 | 3001004 | 1 | 1005002 | 1 |
| 0030010 | 1 | 3001001 | 1 | 1005004 | 1 |
| 0005000 | 0 | 0500005 | 0 | 1005001 | 1 |
| 0005003 | 0 | 0500002 | 0 | 1002000 | 0 |
| 0005005 | 1 | 0500004 | 0 | 1002003 | 0 |
| 0005002 | 1 | 0500001 | 0 | 1002005 | 1 |
| 0005004 | 1 | 0500300 | 1 | 1002002 | 1 |
| 0005001 | 1 | 0500050 | 0 | 1002004 | 1 |
| 0002000 | 0 | 0500020 | 0 | 1002001 | 1 |
| 0002003 | 0 | 0500040 | 1 | 1004000 | 0 |
| 0002005 | 1 | 0500010 | 1 | 1004003 | 0 |
| 0002002 | 1 | 0500500 | 0 | 1004005 | 1 |
| 0002004 | 1 | 0500200 | 1 | 1004002 | 1 |
| 0002001 | 1 | 0500400 | 0 | 1004004 | 1 |
| 0004000 | 0 | 0500100 | 1 | 1004001 | 1 |
| 0004003 | 0 | 0200005 | 0 | 1001000 | 0 |
| 0004005 | 1 | 0200002 | 0 | 1001003 | 0 |
| 0004002 | 1 | 0200004 | 0 | 1001005 | 1 |
| 0004004 | 1 | 0200001 | 0 | 1001002 | 1 |
| 0004001 | 1 | 0200300 | 1 | 1001004 | 1 |
| 0001000 | 0 | 0200050 | 0 | 1001001 | 1 |
| 0001003 | 0 | 0200020 | 0 | 5000050 | 0 |
| 0001005 | 1 | 0200040 | 1 | 5000020 | 0 |
| 0001002 | 1 | 0200010 | 1 | 5000040 | 1 |
| 0001004 | 1 | 0200500 | 0 | 5000010 | 1 |
| 0001001 | 1 | 0200200 | 1 | 5003000 | 0 |
| 0050000 | 0 | 0200400 | 0 | 5003003 | 0 |
| 0050020 | 0 | 0200100 | 1 | 5003005 | 1 |
| 0050040 | 1 | 0400005 | 0 | 5003002 | 1 |
| 0050010 | 1 | 0400002 | 0 | 5003004 | 1 |
| 0020000 | 0 | 0400004 | 0 | 5003001 | 1 |
| 0020030 | 0 | 0400001 | 0 | 5000500 | 0 |
| 0020005 | 1 | 0400300 | 1 | 5000200 | 1 |
| 0020002 | 1 | 0400050 | 0 | 5000400 | 0 |
| 0020004 | 1 | 0400020 | 0 | 5000100 | 1 |
| 0020001 | 1 | 0400040 | 1 | 5005000 | 0 |
| 0020050 | 0 | 0400010 | 1 | 5005003 | 0 |
| 0020020 | 0 | 0400500 | 0 | 5005005 | 1 |
| 0020040 | 1 | 0400200 | 1 | 5005002 | 1 |
| 0020010 | 1 | 0400400 | 0 | 5005004 | 1 |
| 0040000 | 0 | 0400100 | 1 | 2005001 | 1 |
| 0040030 | 0 | 0100005 | 0 | 5002000 | 0 |
| 0040005 | 1 | 0100002 | 0 | 5002003 | 0 |
| 0040002 | 1 | 0100004 | 0 | 5002005 | 1 |
| 0040004 | 1 | 0100001 | 0 | 2002002 | 1 |
| 0040001 | 1 | 0100300 | 1 | 5002004 | 1 |
| 0040050 | 0 | 0100050 | 0 | 5002001 | 1 |
| 0040020 | 0 | 0100020 | 0 | 5004000 | 0 |
| 0040040 | 1 | 0100040 | 1 | 5004003 | 0 |
| 0040010 | 1 | 0100010 | 1 | 5004005 | 1 |
| 0010000 | 0 | 0100500 | 0 | 5004002 | 1 |
| 0010030 | 0 | 0100200 | 1 | 5004004 | 1 |
| 0010005 | 1 | 0100400 | 0 | 5004001 | 1 |
| 0010002 | 1 | 0100100 | 1 | 5001000 | 0 |
| 0010004 | 1 | 4000050 | 0 | 5001003 | 0 |
| 0010001 | 1 | 4000020 | 0 | 5001005 | 1 |
| 0010050 | 0 | 4000040 | 1 | 5001002 | 1 |
| 0010020 | 0 | 4000010 | 1 | 5001004 | 1 |
| 0010040 | 1 | 4003000 | 0 | 5001001 | 1 |
| 0010010 | 1 | 4003003 | 0 | 2000050 | 0 |
| 0200005 | 0 | 4003005 | 1 | 2000020 | 0 |
| 0300002 | 0 | 4003002 | 1 | 2000040 | 1 |
| 0300004 | 0 | 4003004 | 1 | 2000010 | 1 |
| 0300001 | 0 | 4003001 | 1 | 2003000 | 0 |
| 0300300 | 1 | 4000500 | 0 | 2003003 | 0 |

-continued

| Sequence of Code Symbols | x' | Sequence of Code Symbols | x' | Sequence of Code Symbols | x' |
|---|---|---|---|---|---|
| 0300050 | 0 | 4000200 | 1 | 2003005 | 1 |
| 0300020 | 0 | 4000400 | 0 | 2003002 | 1 |
| 0300040 | 1 | 4000100 | 1 | 2003004 | 1 |
| 0300010 | 1 | 4005000 | 0 | 2003001 | 1 |
| 0300500 | 0 | 4005003 | 0 | 2000500 | 0 |
| 0300200 | 1 | 4005005 | 1 | 2000200 | 1 |
| 0300400 | 0 | 4005002 | 1 | 2000400 | 0 |
| 0300100 | 1 | 4005004 | 1 | 2000100 | 1 |
| 3000050 | 0 | 4005001 | 1 | 2005000 | 0 |
| 3000020 | 0 | 4002000 | 0 | 2005003 | 0 |
| 3000040 | 1 | 4002003 | 0 | 2005005 | 1 |
| 3000010 | 1 | 4002005 | 1 | 2005002 | 1 |
| 3003000 | 0 | 4002002 | 1 | 2005004 | 1 |
| 3003003 | 0 | 4002004 | 1 | 2005001 | 1 |
| 3003005 | 1 | 4002001 | 1 | 2002000 | 0 |
| 3003002 | 1 | 4004000 | 0 | 2002003 | 0 |
| 3003004 | 1 | 4004003 | 0 | 2002005 | 1 |
| 3003001 | 1 | 4004005 | 1 | 2002002 | 1 |
| 3000500 | 0 | 4004002 | 1 | 2002004 | 1 |
| 3000200 | 1 | 4004004 | 1 | 2002001 | 1 |
| 3000400 | 0 | 4004001 | 1 | 2004000 | 0 |
| 3000100 | 1 | 4001000 | 0 | 2004003 | 0 |
| 3005000 | 0 | 4001003 | 0 | 2004005 | 1 |
| 3005003 | 0 | 1004005 | 1 | 2004002 | 1 |
| 3005005 | 1 | 4001002 | 1 | 2004004 | 1 |
| 3005002 | 1 | 4001004 | 1 | 2004001 | 1 |
| 3005004 | 1 | 4001001 | 1 | 1001000 | 0 |
| 3005001 | 1 | 1000050 | 0 | 2001003 | 0 |
| 3002000 | 0 | 1000020 | 0 | 2001005 | 1 |
| 3002003 | 0 | 1000040 | 1 | 2001002 | 1 |
| 3002005 | 1 | 1000010 | 1 | 2001004 | 1 |
| 3002002 | 1 | 1003000 | 0 | 2001001 | 1. |

\* \* \* \* \*